(12) United States Patent
Hollis

(10) Patent No.: US 7,933,761 B2
(45) Date of Patent: Apr. 26, 2011

(54) CREATION OF CLOCK AND DATA SIMULATION VECTORS WITH PERIODIC JITTER

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 992 days.

(21) Appl. No.: 11/738,193

(22) Filed: Apr. 20, 2007

(65) Prior Publication Data

US 2008/0262818 A1   Oct. 23, 2008

(51) Int. Cl.
*G06F 17/50* (2006.01)
(52) U.S. Cl. ............... 703/19; 703/2; 703/14; 716/6
(58) Field of Classification Search ............ 703/2, 13, 703/14, 17, 19; 716/4, 6
See application file for complete search history.

(56) References Cited

U.S. PATENT DOCUMENTS

2005/0144580 A1*  6/2005  Berkram et al. ............ 716/6

OTHER PUBLICATIONS

Stephens, R. Analyzing Jitter at High Data Rates, IEEE, Coomunications Magazine, vol. 42, Iss. 2, Feb. 2004, pp. S6-S10.*
Ong, C.-K., A Scaable On-Chip Jitter Extraction Technique, $22^{nd}$ IEEE VLSI Test Symposium, Apr. 2004, pp. 267-272.*
Ong, C.-K., Random Jitter Extraction Technique in a Multi-Gigahertz Signal, IEEE, Design, Automation, and Test in Europe Conference and Exhibition, Feb. 2004, pp. 286-291.*
Kuo et al., C.Y. A Period Tracking Based On-Chip Sinusoidal Jittrer Extraction Technique, $24^{th}$ IEEE VLSI Test Symposium, Apr. 2006, pp. 1-6.*
P. K. Hanumolu, B. K. Casper, R. Mooney, G.-Y. Wei, and U.-K. Moon, "Analysis of PLL Clock Jitter in High-Speed Serial Links," IEEE Transactions on Circuits and Systems-II: Analog and Digital Signal Processing, vol. 50, No. 11, Nov. 2003, pp. 879-886.
G. Balamurugan and N. Shanbhag, "Modeling and Mitigation of Jitter in Multi-Gbps Source-Synchronous I/O Links," Proceedings of the 21st International Conference on Computer Design. IEEE, Oct. 2003, pp. 254-260.
K.K. Kim et al., "ON the Modeling and Analysis of Jitter in ATE Using Matlab," Proc. Of the 2005 $20^{th}$ IEEE Int'l Symp. On Defect and Fault Tolerance in VLSI Systems (2005).

(Continued)

*Primary Examiner* — Russell Frejd
(74) *Attorney, Agent, or Firm* — Wong, Cabello, Lutsch, Rutherford & Brucculeri, LLP

(57) ABSTRACT

Methods for generating simulation vectors incorporating periodic jitter, or phase-shifted periodic jitter are disclosed. Periodic jitter, such as sinusoidal jitter, is preferably represented by a mathematical equation which defines the amount of jitter experienced at each cycle of a clock or data signal. The calculated periodic jitter for each cycle is used to form a new multi-cycle vector incorporating the jitter. If a particular signal to be simulated additionally needs to travel a particular distance such that it would experience a time delay, that time delay may also be incorporated into the jitter equation as a phase shift. So incorporating the time delay into the jitter equation allows for the easy simulation of circuits receiving the vectors without the need to actually design or "lay out" the circuits that imposing the time delay. This technique is particularly useful in efficient modeling, or optimization of, the clock distribution network and sample circuits used to receive data in a SDRAM integrated circuit.

35 Claims, 12 Drawing Sheets

OTHER PUBLICATIONS

Application Note 61W-18431-3, "Controlled Jitter Generation for Jitter Tolerance and Jitter Transfer Testing," Tektronix, Inc. (2005, updated Feb. 23, 2006).

S. Tabatabaei, "Jitter Generation and Measurement for Test of Multi-GBPS Serial IO," ITC Int'l Test Conference, Paper 46.3, pp. 1313-1321 (2004).

* cited by examiner

CREATION OF CLOCK AND DATA SIMULATION VECTORS WITH PERIODIC JITTER

CROSS-REFERENCE TO RELATED APPLICATION

This application is related to U.S. patent application Ser. No. 11/549,646, filed Oct. 14, 2006, which is hereby incorporated by reference in its entirety.

FIELD OF THE INVENTION

Embodiments of this invention relate to improved methods for simulating periodic jitter in a computerized simulation application.

BACKGROUND

It is a common practice in the art of integrated circuit design to simulate the operation of a given circuit using simulation software operating in a computer system. Using simulation software allows the circuit designer to verify the operation and margins of a circuit design before incurring the expense of actually building and testing the circuit. Through the use of such simulations, design errors or risks are hopefully identified early in the design process, and resolved prior to fabrication of actual circuits.

One particular application requiring improved modeling and simulation relates to the synchronization of a clock with data in a serial or source-synchronous interconnect, as is illustrated in FIG. 1. Shown generically is a system 10, which includes a transmitter 12 of a clock signal (CLK) and data signals (Data1 through Data_N), and a receiver 14 of such signals. Such devices may comprise in one useful example a memory controller 12 and a memory integrated circuit 14 (such as a Synchronous Dynamic Random Access Memory (SDRAM)) interconnected by interconnects 15 on a printed circuit board.

As one skilled in the art understands, the clock signal is sent by the memory controller 12 along with the data so that the SDRAM 14 can capture the data in synchronization with the clock. Because the data and clock are sent together, it is hoped that noise affecting one interconnect 15 would similarly affect the other interconnects. In other words, by this scheme, it is hoped that noise will cancel at the SDRAM 14, such that a delay (or advance) in receipt of the data at the SDRAM will be negated by a delay (or advance) in receipt of the clock used to capture the data. Such data capture takes place on the SDRAM 14 at sample circuits 16, which might comprise latches for instance.

When such a scheme is used, it is generally preferred that the timing between the data and the clock not be skewed by either the printed circuit board routing or the circuitry internal to the SDRAM 14. To reduce such skew, it is important to consider the effective length that the clock signal must travel internal to the SDRAM 14. To preserve synchronicity, it is desired that the clock signal arrive at each of the sample circuits 16 at the same time. This can be problematic, because certain of the sample circuits 16 (e.g., that serving Data_N in FIG. 1) will be farther from the entry point of the clock signal than are other sample circuits 16 (e.g., that serving Data1).

To reduce such skewing effects, a distribution network 18 can be employed within the SDRAM 14, with the goal of equating the distances that the clock signal must travel to each of the sample circuits 16 (such that L1=L2= . . . =L_N). This means that certain internal clock signals will intentionally need to be lengthened to match the length of the longest of the internal clock signals (L_N as shown in FIG. 1).

The use of a distribution network 18 to reduce data capture skew is generally non-problematic for a relatively slow-speed system. However, at faster data rates, the distribution network 18 can cause misalignment of the cycles between the data and clock signals. For example, assume that the distribution network 18 causes an internal delay equal to 2 nanoseconds (ns). Assume further that the clock signal is a 1 GHz clock (i.e., with a period of 1 ns). The effect of the distribution network 18 would be to delay the receipt of the clock at the sample circuits 16 by two clock cycles. This means that each $N^{th}$ clock cycle would be used to capture each $(N+2)^{th}$ data signal at the sample circuits 16. This is illustrated in FIG. 2. As can be seen, at the transmitter (memory controller) 12, the clock cycle and data signals are essentially periodically aligned, such that the first clock pulse (CLK1) is transmitted with the first byte (word, etc.) of data (D1). (Actually, in recognition of the necessity of at least some minimal internal clock delay at the receiver 14, the clock cycles may be issued some amount, A, in advance of their corresponding data). However, at the receiver 14, due to the delay in the clock distribution network 18, it can be seen that the first clock pulse (CLK1) captures the third byte of data (D3) at the sample circuits 16 at its rising edge; the second clock pulse (CLK2) captures the fourth byte of data (D4); etc. In short, and as mentioned earlier, this misaligns the data with the clock at the receiver (SDRAM) 14.

While there is nothing wrong with such clock-to-data misalignment at the sample circuits 16 as a general matter, such misalignment is at odds with the assumption that simultaneous transmission of clock and data helps in canceling noise. For example, assume that noise causes simultaneously-transmitted clock and data (CLK_N and D_N) to be delayed by some amount, j(N), where j(N) can be positive (representing a delay) or negative (representing an advance). Such a time shift can generically be referred to as "jitter." Were such simultaneously-transmitted signals simultaneously received at the sample circuits 16, i.e., a positive correlation, any such jitter j(N) would tend to cancel out, such that the data would be appropriately sampled. However, such cancellation of jitter is not guaranteed when the reality of the distribution network 18, and its associated misalignment, is appreciated. For example, consider the capture of data signals D3, which were delayed (or advanced) ("jittered") by j(3). In the example illustrated in FIG. 2, such data signals will be captured by CLK1, which has its own jitter of j(1), which, due to the difference in time, might not equal jitter j(3).

Because of the reality of jitter, it becomes important to model or simulate the performance of the sample circuits 16 in light of such jitter, to gauge whether such circuits will satisfactorily sample the incoming data, and with what bit error rate. A simple example of sample circuits 16 are shown in FIG. 3. As shown, an operational amplifier (op amp) 20 compares the received data to a mid-point reference voltage (e.g., ½ the operating voltage Vdd), which is sampled by enabling the op amp 20 on the rising edge of the clock signal, CLK. The output of the op amp 20 (Vout_N) represents a sampled version of the input data (Data_N). By simulating the operation of the sample circuits 16 in light of any jitter that might be present on the clock and data inputs, a designer can tell how tight sensing margins are for the sample circuit 16, and/or the expected bit error rate of the sample circuit 16.

A particularly difficult problem in the context of simulation of sample circuits involves the real possibility of periodic jitter, i.e., jitter that causes the timing of the signals to vary or oscillate in a periodic manner from cycle to cycle. Forms of periodic jitter are common in realistic systems, where regular data and/or clock combinations excite resonant modes in the transmitters or receivers (or their integrated circuit (IC) packages) that translate into jitter on the edges of the traveling signals. Most often the periodicity is first observed in the clock signal, but is then transferred to the data signals as the data bits are re-timed and launched by the jittery clock edges. Efficient modeling of such periodic jitter is therefore useful to a circuit designer, and as will be seen below, is particularly useful in modeling the bit error rates of the sample circuits 16 and their associated links.

Periodic jitter is shown in FIG. 4 with reference to a clock signal, in which an ideal (non-jittered) clock signal is shown in solid lines, with a periodically-jittered clock shown in dotted lines for comparison. Because the sample circuits 16 illustrated above only sample data on the clock's rising edges, periodic jitter in FIG. 4 is only illustrated with respect to clock's rising edges for simplicity. However, the falling edges could also be used to sample the data, as is done in double-data rate (DDR) systems, and such falling edges could similarly be affected by periodic jitter. The graph at the bottom of FIG. 4 shows the magnitude of the jitter, j(i), from its otherwise ideal value as a function of the $i^{th}$ rising edge (or each $i^{th}$ cycle) of the clock. The jitter, j(i), is a measure of time, and may be on the order of picoseconds for example. As the graph illustrates, the jitter is indeed periodic, and in this case, more specifically, is sinusoidal.

Even if the DC skew or gross timing of the arrival of the data and the clock at the sample circuits 16 is optimized for perfect alignment, the phase difference in the periodic jitter between the data and the clock may not enjoy a good correlation. For example, if the phase difference between the jitter on the data and on the clock is 180 degrees (i.e., negatively correlated), the periodicity of the jitter may cause the data to arrive maximally early at the sample circuits, while the clock arrives maximally late, or vice versa. Such negative correlation can substantially reduce sensing margins at high data and clock rates.

Unfortunately, simulating the effects of periodic jitter is not easy to accomplish. Particularly, because of the clock distribution network 18's effect on the clock signal prior to receipt at the sample circuits 16, it would generally be necessary to construct the distribution network 18 prior to running the simulation. This is undesirable, both because it requires additional work, and because simulation may actually be useful in optimizing the distribution network 18 to achieve a suitable bit error rate at the sample circuits 16. In short, an improved technique, one that is not so laborious, is preferred, and is disclosed herein.

DETAILED DESCRIPTION

Figure 4:
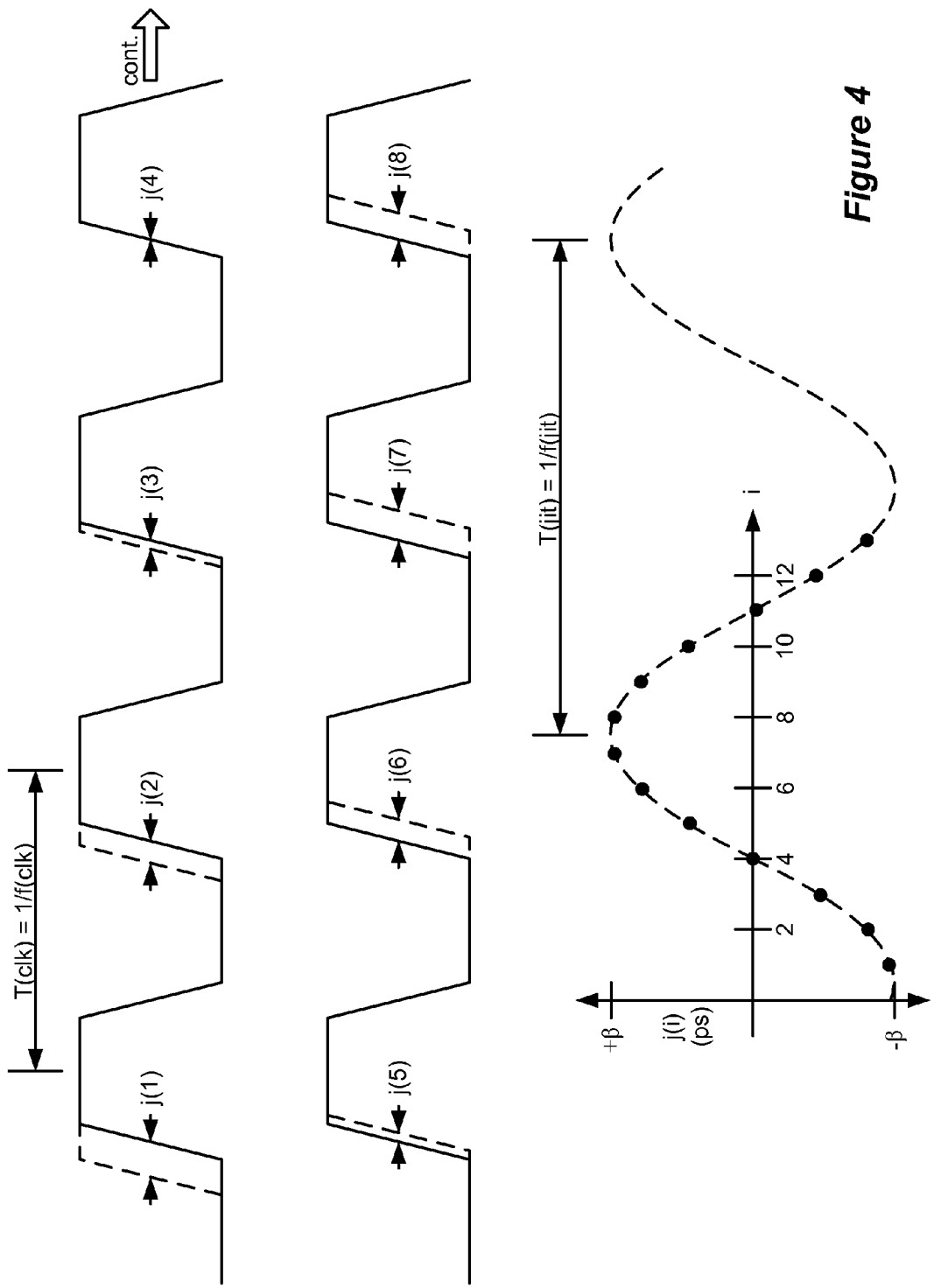
FIG. 4 illustrates the superposition of periodic (sinusoidal) jitter on an otherwise ideal clock signal.

In a preferred embodiment, the disclosed technique involves, at a minimum, providing periodic jitter over a plurality of cycles of data signals and/or clock signals to be simulated. To revisit the graph at the bottom of FIG. 4, shown is the magnitude of the periodic jitter, j(i), from its otherwise ideal value as a function of the $i^{th}$ rising edge (or each $i^{th}$ cycle) of the clock. The jitter, j(i), is a measure of time, and may be on the order of picoseconds for example. The periodic jitter in this specific example is sinusoidal. The maximum jitter reaches $+/-\beta$ picoseconds and occurs periodically in accordance with the jitter frequency, f(jit), The jitter frequency, f(jit), can also be observed in the graph, and this frequency may differ in a realistic setting from the frequency of the clock, f(clk).

Recognizing this, the jitter at each $i^{th}$ edge of the clock signal can be represented mathematically as:

$$j(i)=\beta*\sin(2\pi*(f(jit)/f(clk))*i) \qquad \text{Eq. 1}$$

Figure 5A:
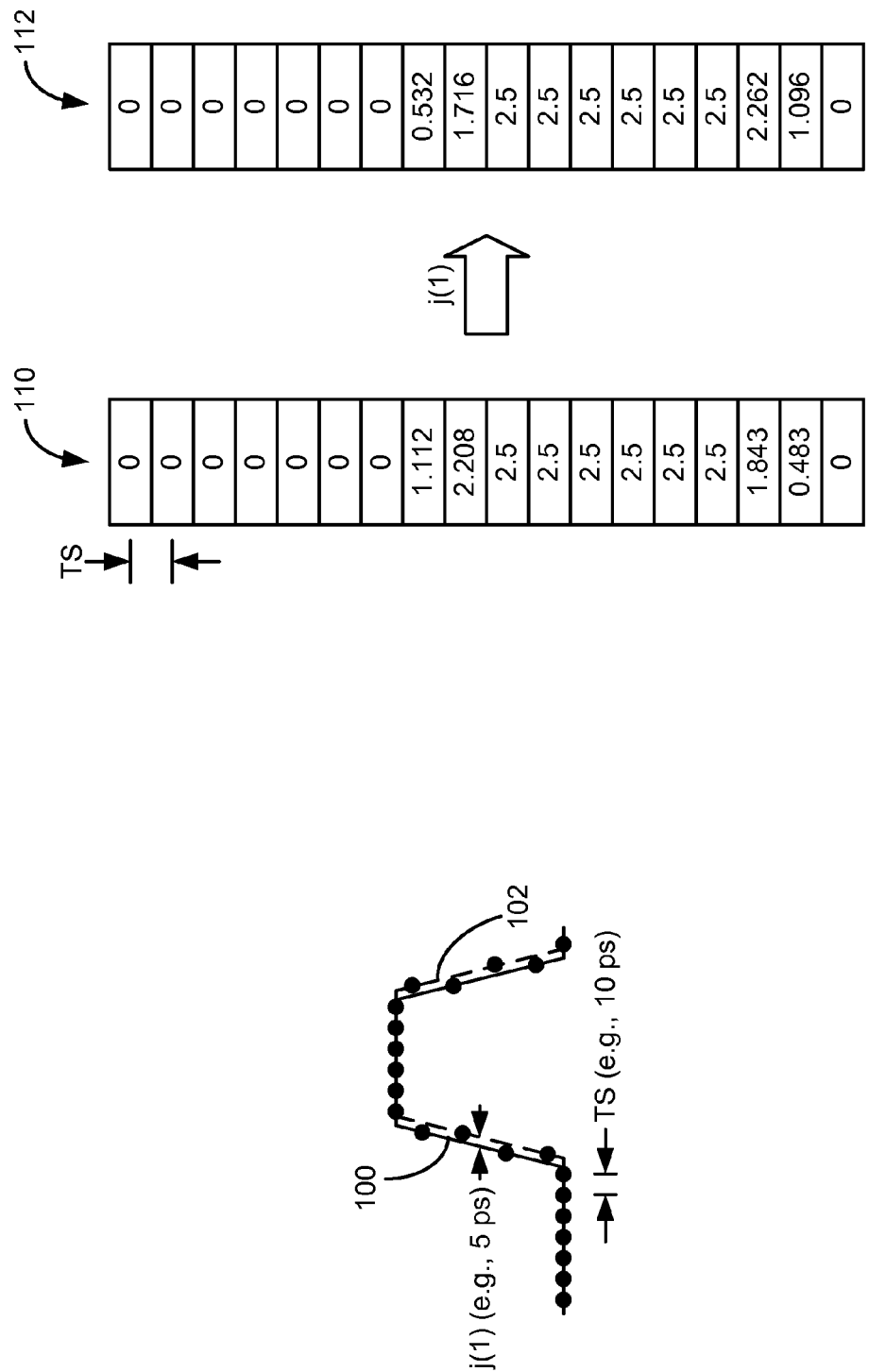
FIGS. 5A and 5B illustrate the modification of an ideal simulation vector for a clock signal to include periodic jitter.

Given such an expressible form for the periodic jitter, and according to one aspect of the disclosed technique, a periodic jitter can be easily imposed onto an otherwise ideal signal, thus easily allowing a periodically jittered signal to be created for simulation. For example, suppose it is desired to impose periodic jitter onto an ideal clock signal to be used as an input to a simulation program. One such cycle of an ideal (non-jittered) clock signal is shown in FIG. 5A as waveform 100. The idealized single-cycle clock waveform 100 would be represented in a simulator program such as Spice™ as a vector 110 of points. The ideal vector 110 includes the magnitude of the waveform at each point (e.g., in Volts), with the points in the vector being separated by a minimum time step (TS). As one skilled in the art will realize, the time step (TS) to be used in the definition of vector 110 should be sufficiently small to accurately capture the nuances of the waveform to be simulated, and might be around 10 picoseconds or so.

This ideal clock cycle waveform 100, and its associated vector 110, can be modified pursuant to its jitter value of Equation (1) to incorporate periodic jitter, resulting in a new single-cycle jittered waveform 102 and its associated jittered vector 112. As previously discussed, Equation (1) will predict (in picoseconds) the amount of jitter effecting the rising edge of each clock cycle. For example, assume that characteristics of the periodic jitter (i.e., $\beta$, f(jit), f(clk)) can be reasonably anticipated or are otherwise well known. Such characteristics, and the resulting computation of j(i) pursuant to Equation (1), may show that the first rising edge (i.e., i=1) should lag the otherwise ideal rising edge in the first clock cycle by 5 picoseconds (i.e., j(1)=5 ps), as shown in FIG. 5A. Given this computation, the a new vector 112 is created, which is indicative of the time shift that j(1) creates in the first cycle.

Figure 5B:
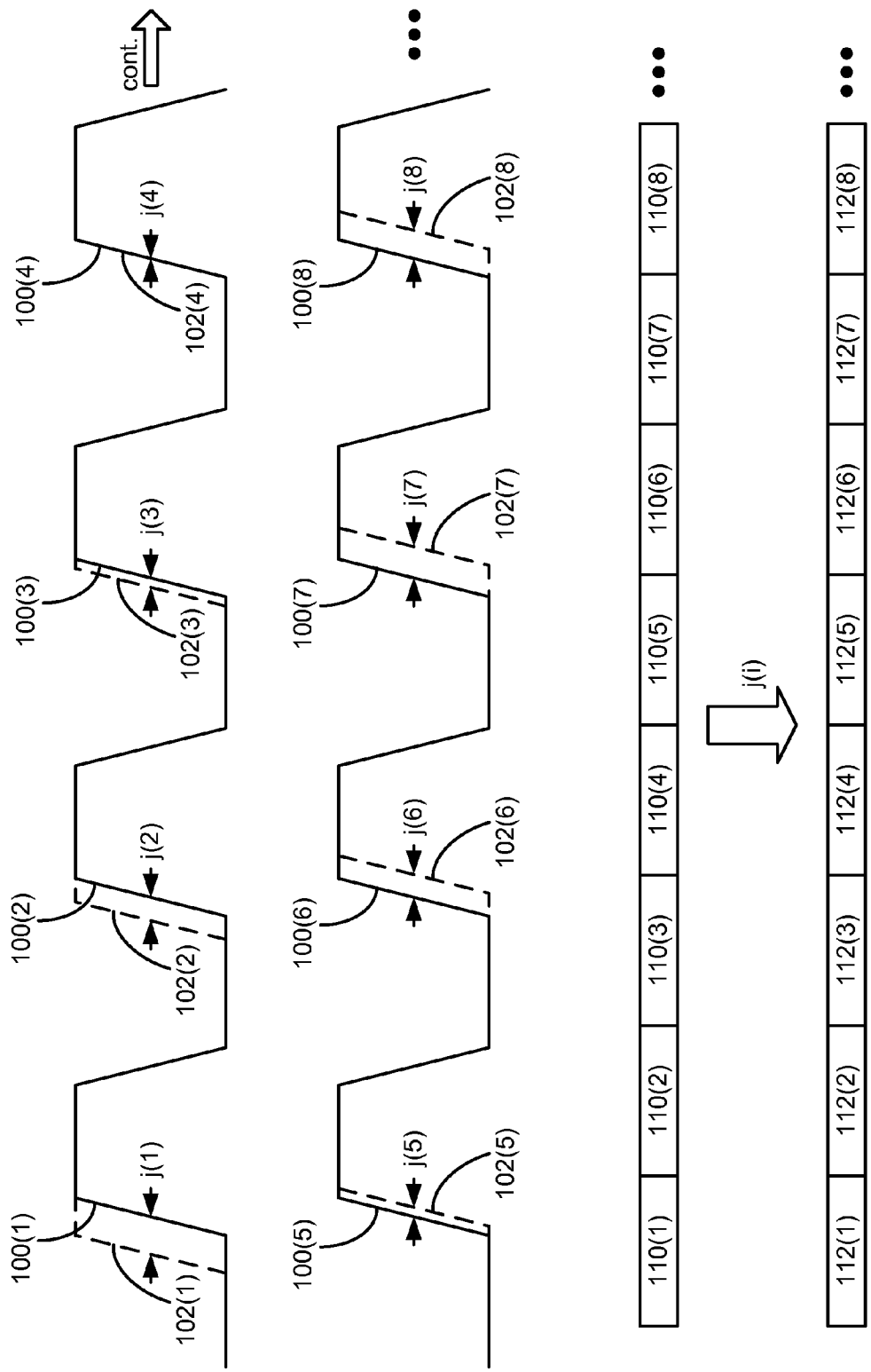

To fully populate a multi-cycle jittered clock vector for simulation, this same process as described above in FIG. 5A needs merely to be undertaken on a cycle-by-cycle basis. This is illustrated in FIG. 5B, which shows a train of eight clock cycles, both in ideal (non-jittered) form 100(i) and in a periodically-jittered form 102(i). Specifically, jitter j(i) is used to create a corresponding jittered clock cycle 102(i) as represented by its associated vectors 112(i), as explained above. Then, to complete a multi-cycle jittered clock waveform for simulation, the various jittered vector cycles 112(i) are concatenated as shown, which again is easily accomplished within the computing environment used for the simulation program.

Figure 6A:
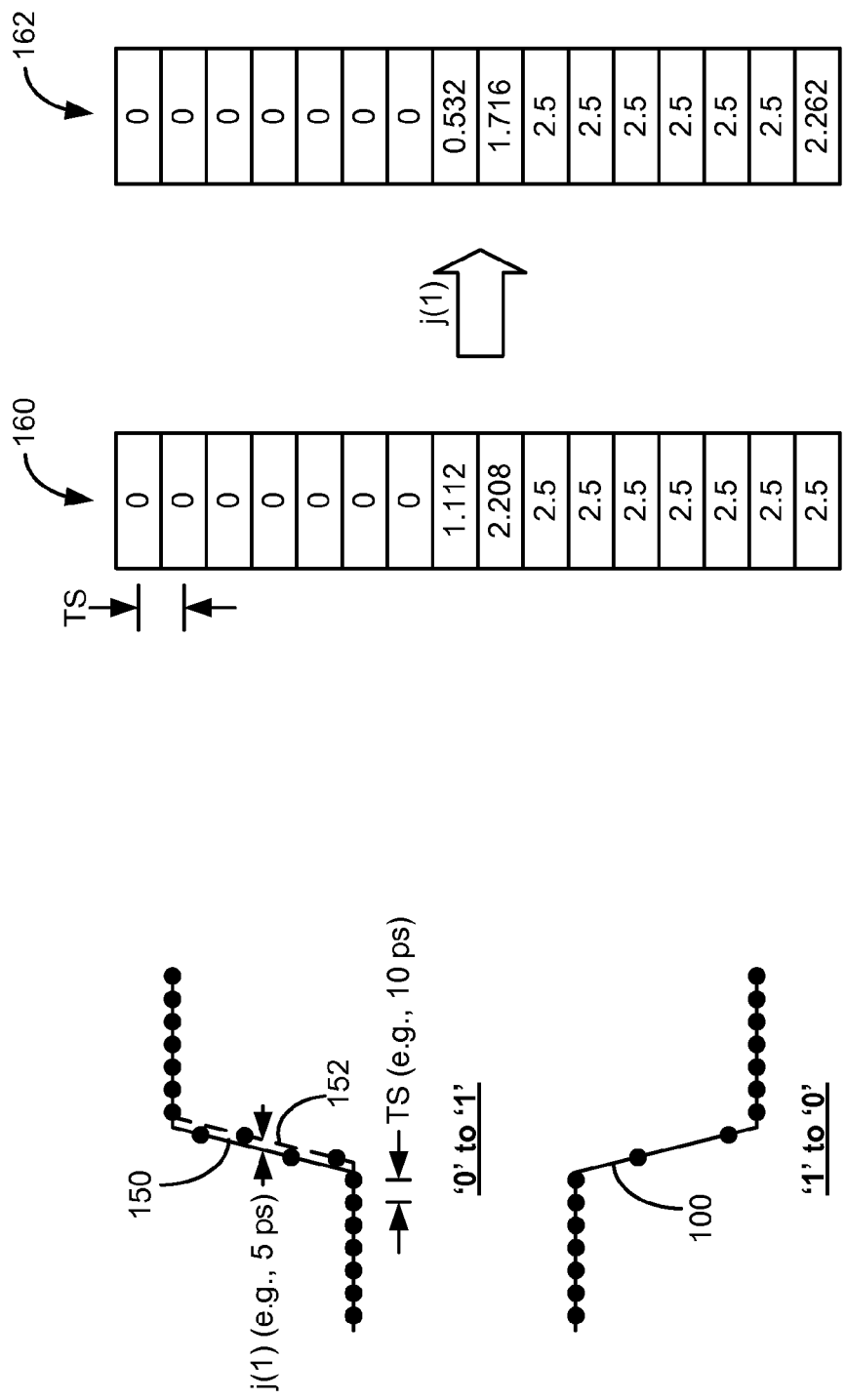
FIGS. 6A and 6B illustrate the modification of an ideal simulation vector for a data signal to include periodic jitter.
Figure 6B:
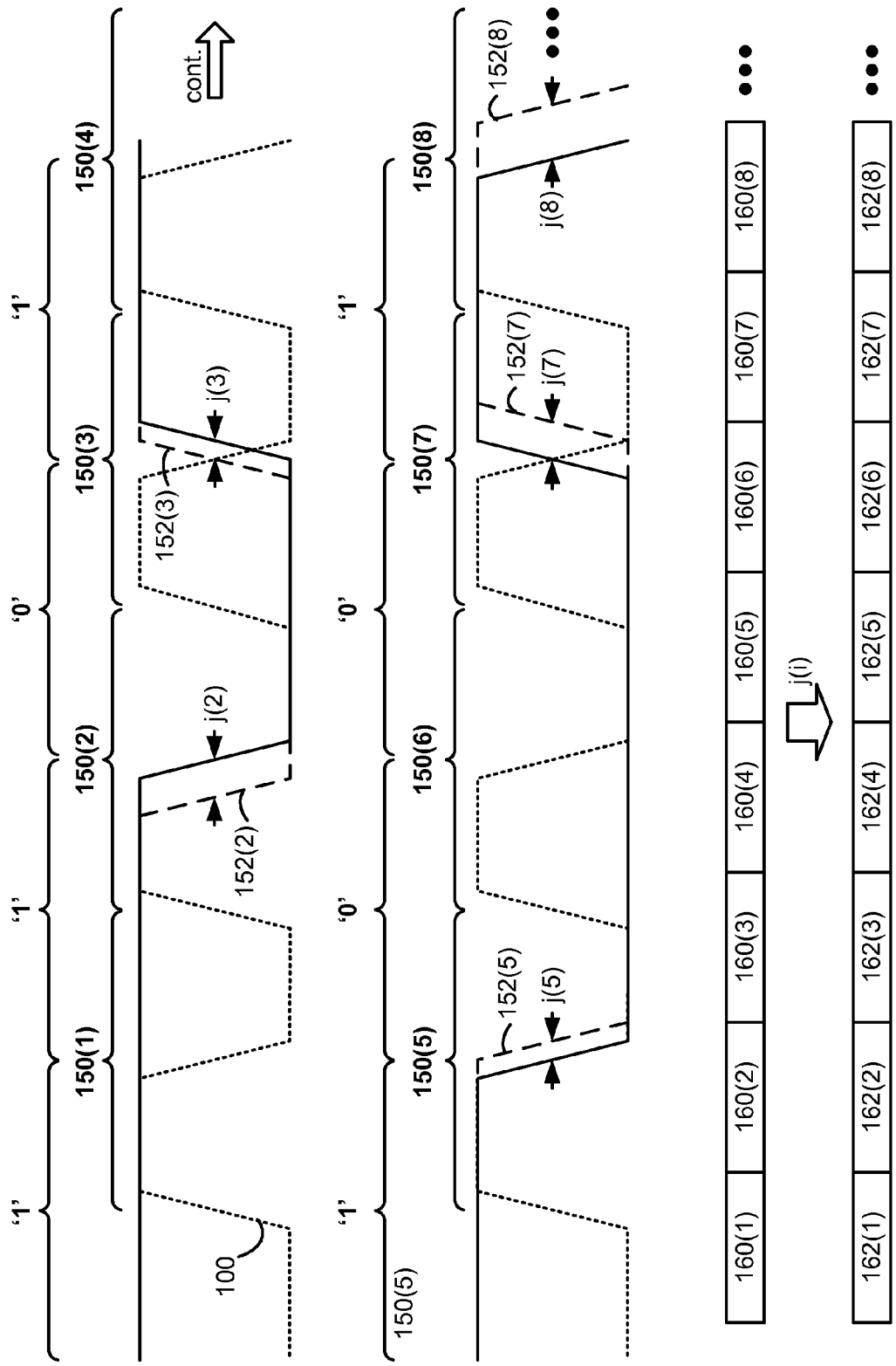

The incorporation of periodic jitter into a signal to be simulated can be applied to data waveforms as well, as illustrated in FIGS. 6A and 6B. FIG. 6B shows a data bit sequence of '11011001.' The cycles of an ideal waveform representing these data signals (as superimposed on an ideal clock 100, such as the clock that might be used to sample the data signals) are represented by waveforms 150(i), which show the transitions between sequential bits of data. Recognizing that such transitions are only significant when the data state is changed between subsequent data bits, the idealized waveforms 150(i) of significance amount to a '0' to '1' transition and a '1' to '0' transition, each of which is shown in FIG. 6A. Additionally, the idealized '0' to '1' vector 160, such as would be used by a simulation program, is shown. (The '1' to '0' vector is not shown for simplicity, but would be treated similarly). The periodically-jittered version of this depicted '0' to '1' waveform, i.e., as jittered by j(1), is represented by waveform 152, with its corresponding vector 162 also shown.

The effect of the periodic jitter on a data signal can be seen in FIG. 6B. Just as with the clock signal, the effects of periodic jitter causes a lead or lag in the otherwise idealized transitions (rising edges or falling edges) from one data state to another. Specifically, it can be seen that jitter values j(2), j(3), j(5), j(7), and j(8) experience periodic jitter so as to deviate from the ideal, which again works a time shift in their associated vectors 162(i). Again, because a failure of the data to transition to a different data state is uninteresting, notice that jitter values corresponding to j(1), j(4), and j(6) are not present, and thus the idealized vectors 160(1), 160(4), 160(6), and their associated values in the concatenated jittered vector 162(1), 162(4), 162(6), would remain constant values and unchanged. Specifically, vectors 160(1), 160(4), 162(1), and 162(4) would comprise optimal logic '1' values, e.g., 2.5 Volts, while vectors 160(6) and 162(6) would comprise optimal logic '0' values, e.g., 0.0 Volts. Vectors 162(2), 162(3), 162(5), 162(7), and 162(8) however, corresponding to shifts in data state, vary from their corresponding idealized vectors 160 to incorporate the effects of periodic jitter, and once again are concatenated to provide a continuous vector 162 suitable for simulation in a typical simulation program.

To summarize the disclosed technique to this point, it is seen how an a multi-cycle simulation clock or data vector having periodic jitter can be created. Starting with 'i' ideal cycles of each, the periodic jitter for each cycle is computed using a suitable equation (such as equation 1, in which the periodic jitter is sinusoidal), and each cycle's vector is appropriately time shifted, and then concatenated. This is easily accomplished within the computing environment used to run the simulator program. (Such computing environment is explained in some detail below with reference to FIG. 10). With multiple cycles of a clock or data so modified to include periodic jitter, more realistic input vectors can be created for simulation to understand the effect of that jitter. Moreover, because the periodic jitter is represented by a mathematical formula, such as the sinusoidal jitter Equation 1 set forth above, it is easy to vary the inputs to the jitter equation, e.g., β, f(jit), and f(clk), to see the impact on simulation results. Such flexibility to model or change the jitter is useful in understanding the response of the system being simulated, and can help in the design of safeguards to add margin against periodic jitter, such as filters and the like.

Figure 1:
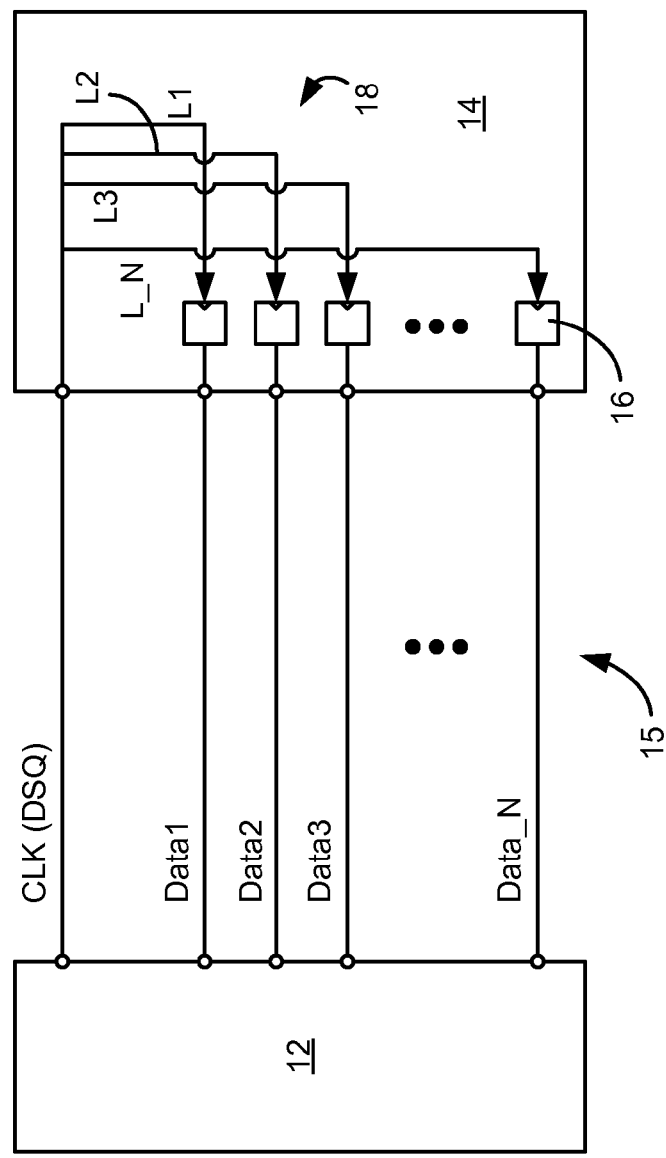
FIG. 1 is an illustration of a system including a transmitter of data and a clock signal, and a receiver for capturing the data signals in synchronization with the clock signal.
Figure 2:
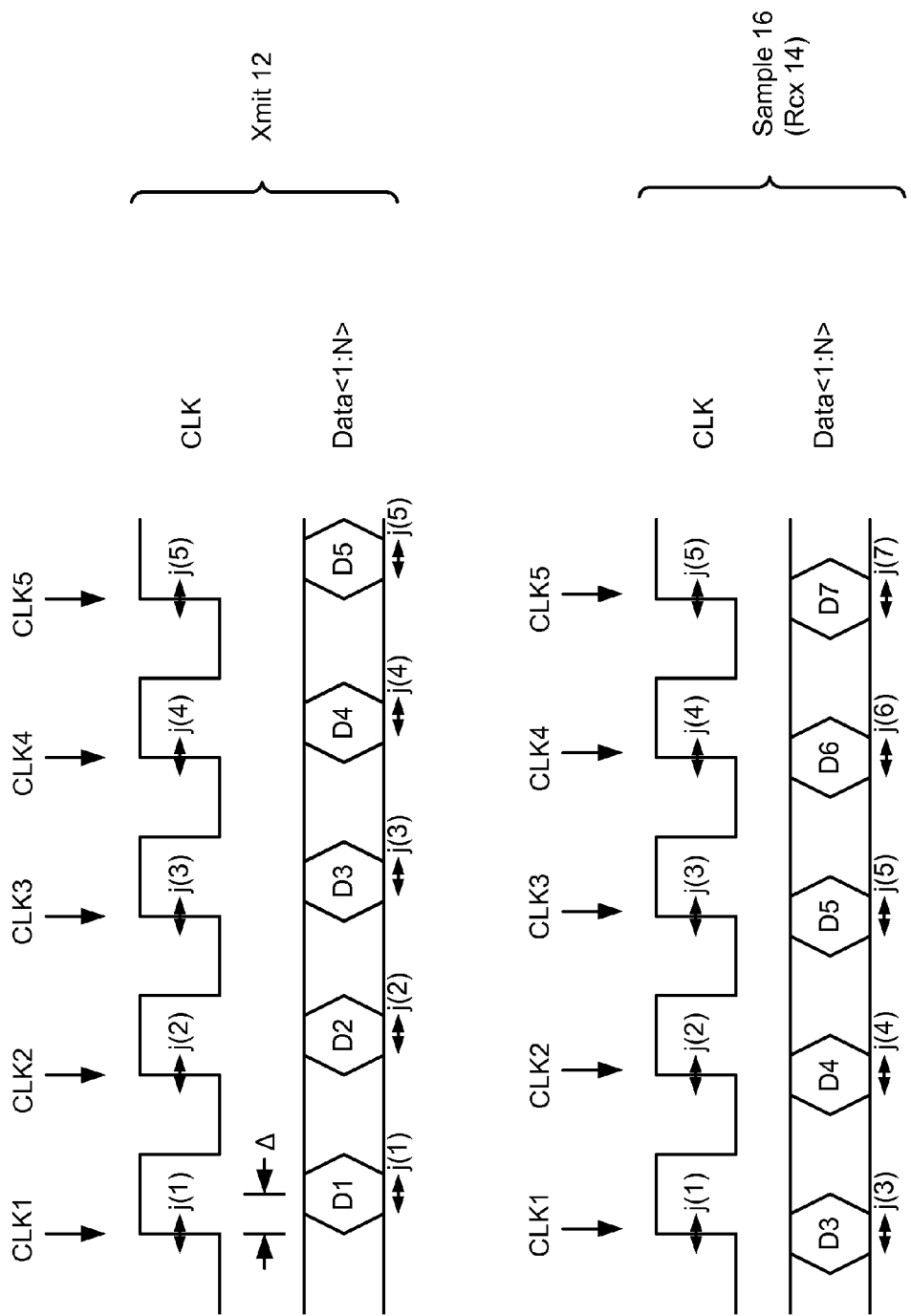
FIG. 2 illustrates how a clock distribution delay within the receiver can give rise to clock-to-data misalignment at the receiver.
Figure 3:
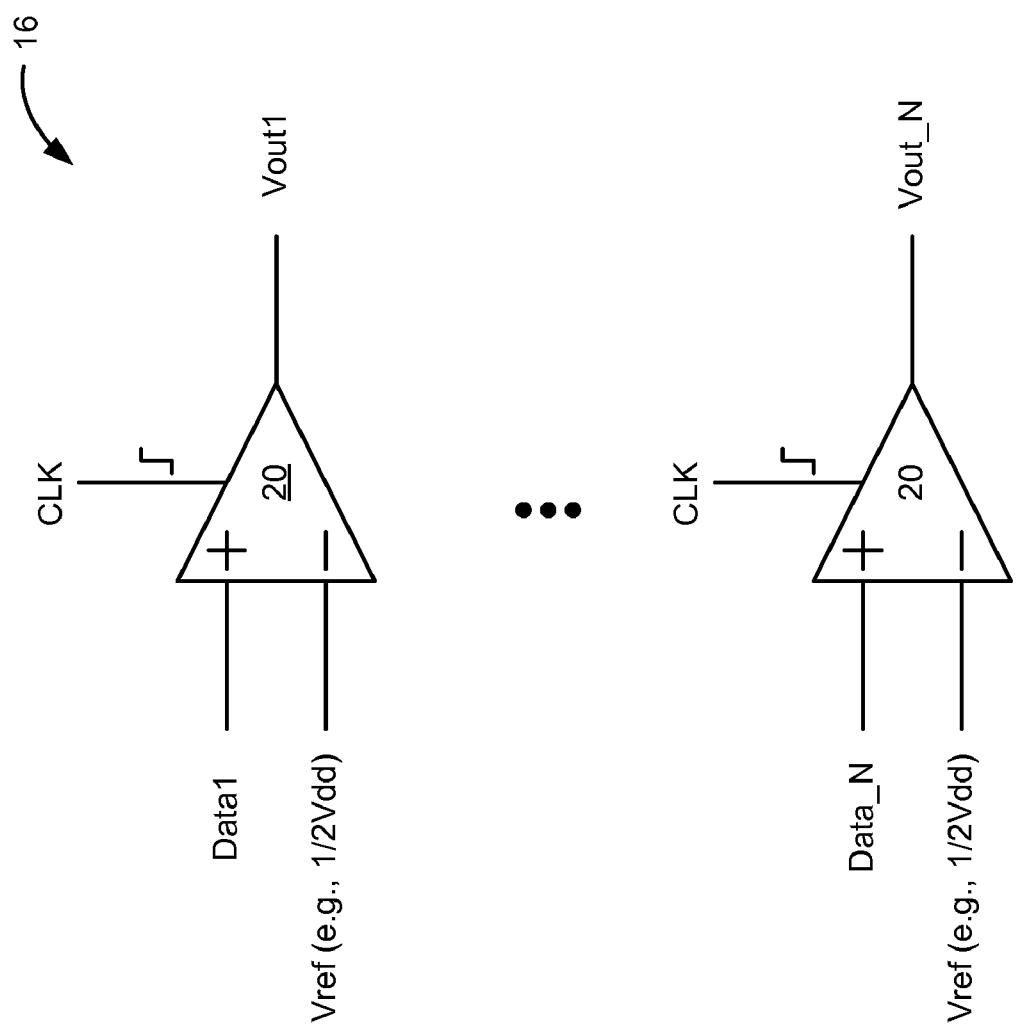
FIG. 3 illustrates the sample circuits at the receiver for sampling the data in synchronization with the clock.

The disclosed technique readily lends itself to modification to allow quick simulation of the clock signals and data signals at the sample circuits 16. As noted earlier with respect to FIG. 1, reduction of skew at sample circuits 16 requires a distribution network 18 designed such that the clock signal internally travels paths of substantially equal lengths (delays) to each data bit's sample circuit 16. As also previously discussed, in high speed systems, this causes clock-to-data misalignment, which can exacerbate noise, and particularly noise which might be associated with periodic jitter. Despite the reality of the increased susceptibility of the sample circuits 16 to noise when met with such misalignment, and the possibility of negatively correlated periodic jitter between the clock and the data, the traditional simulation approach to understanding the effects of such noise requires the distribution network 18 to be fully designed for simulation. This is unfortunate, because it requires the extra work of designing and modeling the clock distribution network 18; it is further unfortunate because it requires modeling of the distribution network 18 before it is really known what design (e.g., effective lengths) for the distribution network 18 would render the best results (e.g., bit error rate) at the sample circuits 16.

According to embodiments of the invention, it is not required to first model or "lay out" the distribution network 18 prior to simulation. Instead, the time delay imposed by the effective length (L1=L2= . . . =L_N) of the distribution network 18 can be represented generically by a value, d. When the clock distribution networks 18's delay to each sample circuit 16 is so modeled by delay d, the periodic jitter at each $i^{th}$ edge of the clock signal at the sample circuits 16 can be represented mathematically as:

$$j_{clk}(i)=\beta *\sin(2\pi *(f(jit)/f(clk))*(i-(d*f(clk)))) \quad \text{Eq. 2}$$

In short, the delay imposed by the distribution network comprises a phase shift to the jitter vector $j_{clk}(i)$. This means that the effect of the distribution network 18 can be effectively evaluated at the sample circuits 16, without requiring that the distribution network 18 actually be modeled or "laid out" by a circuit designer. Instead, only the assumption of the delay time through the distribution network 18, d, needs to be made. This allows appropriate input vectors with periodic jitter to be quickly created, and used as inputs to the sample circuit 16 to simulate performance, and (if enough cycles are used) to calculate a bit error rate for the sample circuit. As noted earlier, simulating the effect of the relative phases of the periodic jitter of the clock and the data on the system can be valuable, even if techniques have otherwise been employed to remove the mean error (i.e., gross timing) between the data and clock at the sample circuits 16. Such a simulation is especially important should misalignment of the clock and data by virtue of the distribution network 18 cause jitter phases that are negatively correlated.

Figure 7:
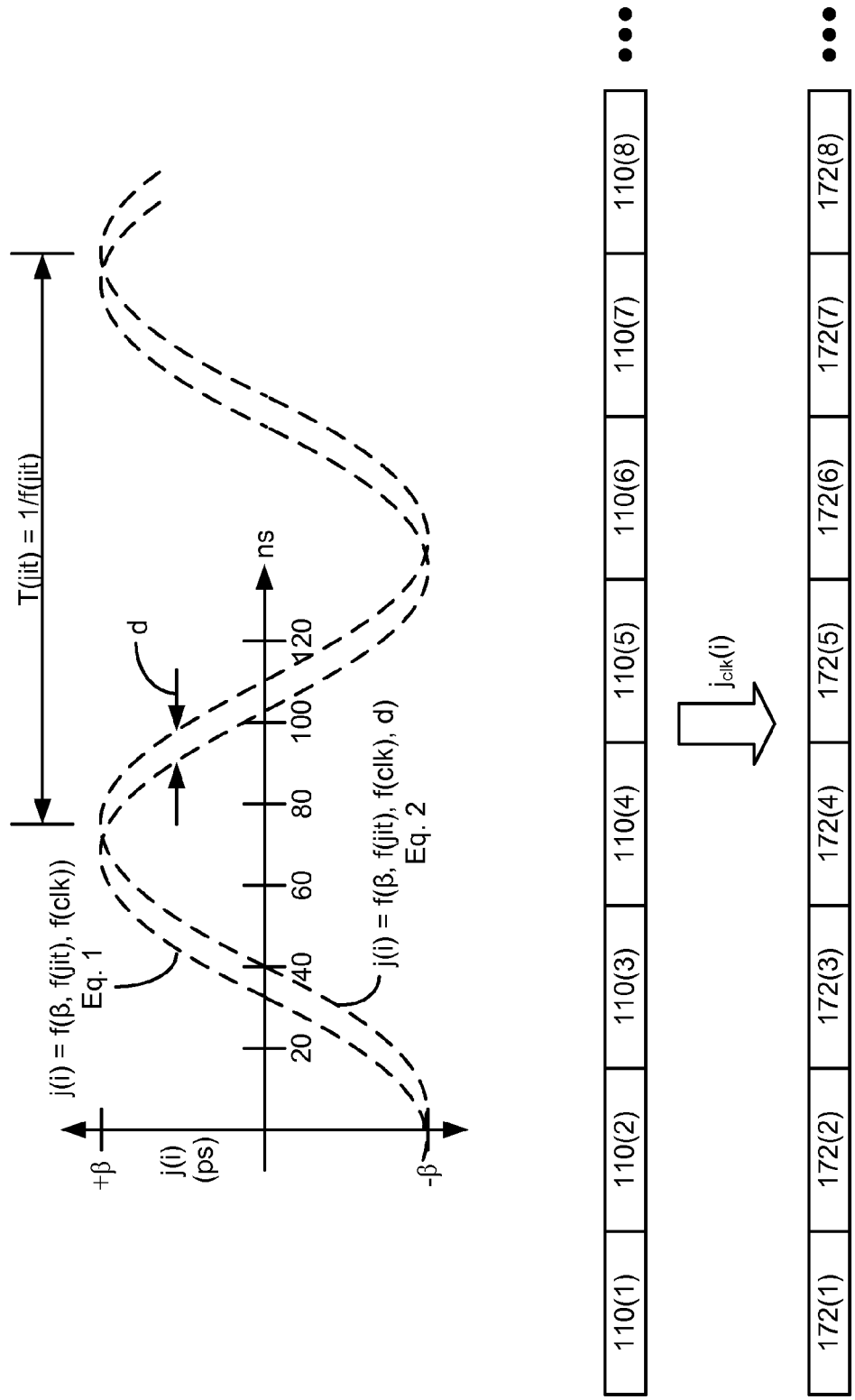
FIG. 7 illustrates the modification of an ideal simulation vector for a clock signal to include phase-shifted periodic jitter.

The use of Equation 2 to form a clock with a phase-shifted periodic jitter is shown diagrammatically in FIG. 7. First, the graph in FIG. 7 shows how the additional consideration of the time delay through the distribution network, d, works a phase shift in the jitter, j(i). (This graph is similar to the graph in FIG. 4, with the X-axis modified to show changes in jitter in real time, instead of as a function of a particular clock edge).

Figure 8:
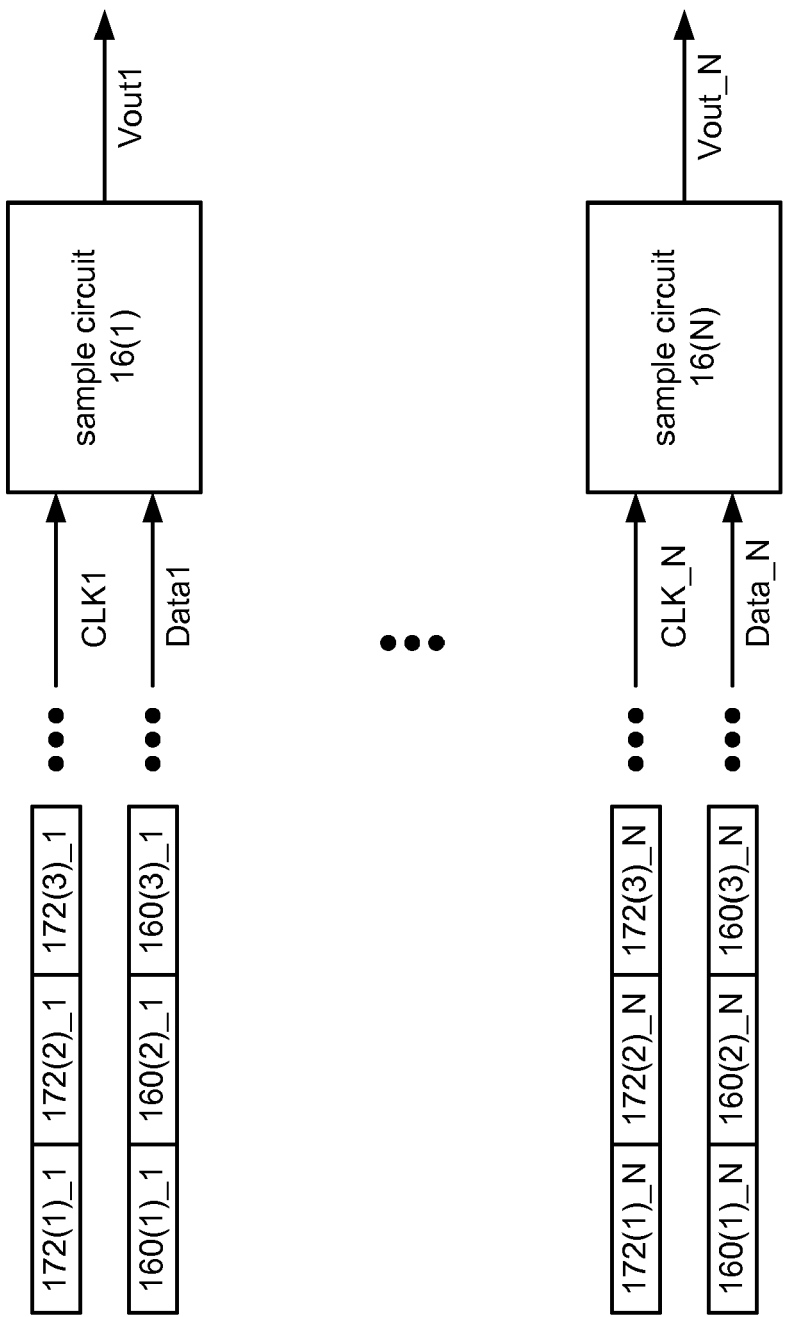
FIG. 8 illustrates how the modified clock signal vector of FIG. 7 can be used in the simulation of a sample circuit.

FIG. 7 further shows once again, that new clock vectors for each cycle, 172(i), are formed, which includes the effect of periodic jitter as phase shifted by d. When concatenated together, these cycles 172(i) form the clock vector to be input to the sample circuits 16, as illustrated in FIG. 8. In FIG. 8, because the data vectors 160(i) input to the sample circuits 16 may well be different, they are individualized for each of the N sample circuits 16. Additionally, individualized clock input vectors 172 containing phase-shifted periodic jitter are generated and shown for each of the N sample circuits 16, although if the lengths L_N of the various legs of the distribution network are substantially equal and no other perturbing effects are present, such clock vectors 172 could be the same at each sample circuit for purposes of simulation. However, using unique clocks for each sample circuit is preferred to better understand the error rates for the data bus as a whole instead of on an individualized bit basis. Regardless, it can be seen from FIG. 8 that the distribution network 18 need not be designed to test its effect at the sample circuits, 16 and instead the phase-shifted, periodically jittered version of the clock (172(i)) is all that is needed to begin simulation.

Moreover, it should be appreciated that this streamlined simulation approach can be useful in assisting in a proper design of the distribution network 18. For example, assuming enough clock and data cycles 172(i), 160(i) are used for the input vectors, and assuming a particular delay in the distribution network 18 of $d_1$, and applying statistics as necessary, a particular bit error rate $\epsilon_1$ might be deduced or observed for one of the N channels (or for all channels taken together). Such error rate $\epsilon_1$ might be unusually high because the delay $d_1$ chosen for the distribution network causes a negative correlation between the phases of the periodic jitters in the clock and the data (e.g., early arriving clock with late arriving data, etc.). If that bit error rate is unacceptable, a new delay $d_2$ could be easily chosen to quickly form a new clock input vector to simulate the resulting bit error rate $\epsilon_2$. In short, d can easily be varied to assess its impact on the bit error rate $\epsilon$, which in turn can help the designer in designing the length L of the distribution network 18 for optimal performance. Of course, other periodic jitter parameters such as the jitter frequency, f(jit), could also be modified during simulation (even if it can't be modified in an actual system) to quantify and understand the sensitivity of the system to the frequency of the periodic jitter.

Figure 9:
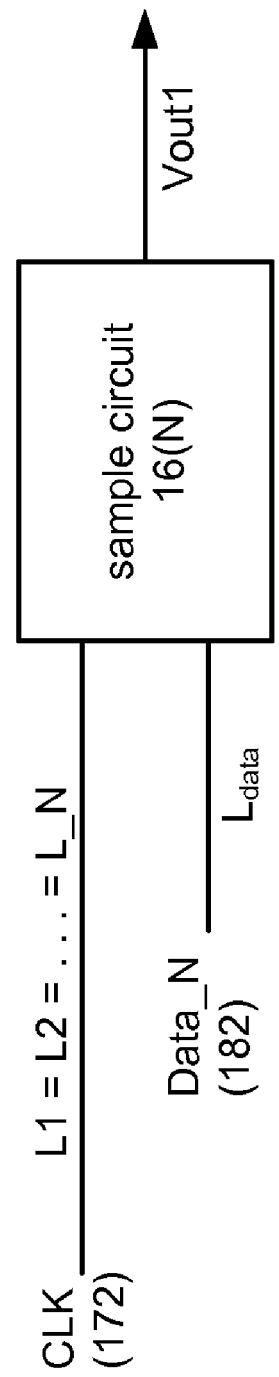
FIG. 9 shows how phase-shifted periodic jitter can be applied to both clock and data before being input to a sample circuit to be simulated.

While FIG. 8 depicts simulation using a phase-shifted periodic jitter as applied to a clock signal, it should be understood that the data vectors can also be subject to periodic jitter, including a phase-shifted periodic jitter. For example, and as shown in FIG. 9, although the internal distance that the data must travel to the sample circuits 16 may be relatively small, $L_{data}$, this distance will produce at least some delay, $d_{data}$, that may cause a phase shift in any periodic jitter present on the data lines. Recognizing this, data vectors 182 can, along with the clock vectors 172 be constructed in accordance with the following equations:

$$j_{clk}(i)=\beta_{clk}*\sin(2\pi*(f(jit)_{clk}/f(clk))*(i-(d_{clk}*f(clk)))) \qquad \text{Eq. 3}$$

$$j_{data}(i)=\beta_{data}*\sin(2\pi*(f(jit)_{data}/f(clk))*(i-(d_{data}*f(clk)))) \qquad \text{Eq. 4}$$

As these equations reveal, it is possible for periodic jitter associated with the data and clock to have different magnitudes ($\beta_{data}$ versus $\beta_{clk}$) or different frequencies (f(jit)$_{data}$ versus f(jit)$_{clk}$), although in realistic embodiments, these variables may be the same. For example, it would usually be the case that f(jit)$_{clk}$=f(jit)$_{data}$, because the jittered clock is used to launch the data at the point of transmission. In any event, is it computationally simple in the simulation computer environment to create new simulation vectors used in assessing the performance of the sample circuits 16.

It should be noted that while modification of simulatable clock and data vectors using sinusoidal jitter has been disclosed, any other periodic equation useful in modelling the jitter may be used as well (e.g., sawtooth waves, etc.). In this regard, periodic jitter should be understood broadly as any sequence that repeats over a number of cycles. Moreover, periodic jitter need not in all useful embodiments be capable of being easily represented as mathematical formulas as disclosed herein, but could instead take on more discrete forms, such as the form of a repeating look up table, etc.

In another modification, it should be understood that the disclosed technique is easily modified to include multiple periodic jitter components. In this regard, it should be noted that multiple jitter components can co-exist so as to jitter a clock or data signal in an actual application. Fortunately, the modeling of multiple periodic jitter components is easily handled via the disclosed techniques. For example, consider a clock signal jittered by two sinusoidal jitter components each having its own set of parameters ($\beta_1$, f(jit)$_1$; and $\beta_2$, f(jit)$_2$). Because the effects of the jitter will be additive, the jitter at each cycle ($j_1(i)$, $j_2(i)$), whether phase shifted or not, need merely be calculated and added together for each cycle prior to modification of an otherwise ideal clock signal, as discussed above.

Figure 10:
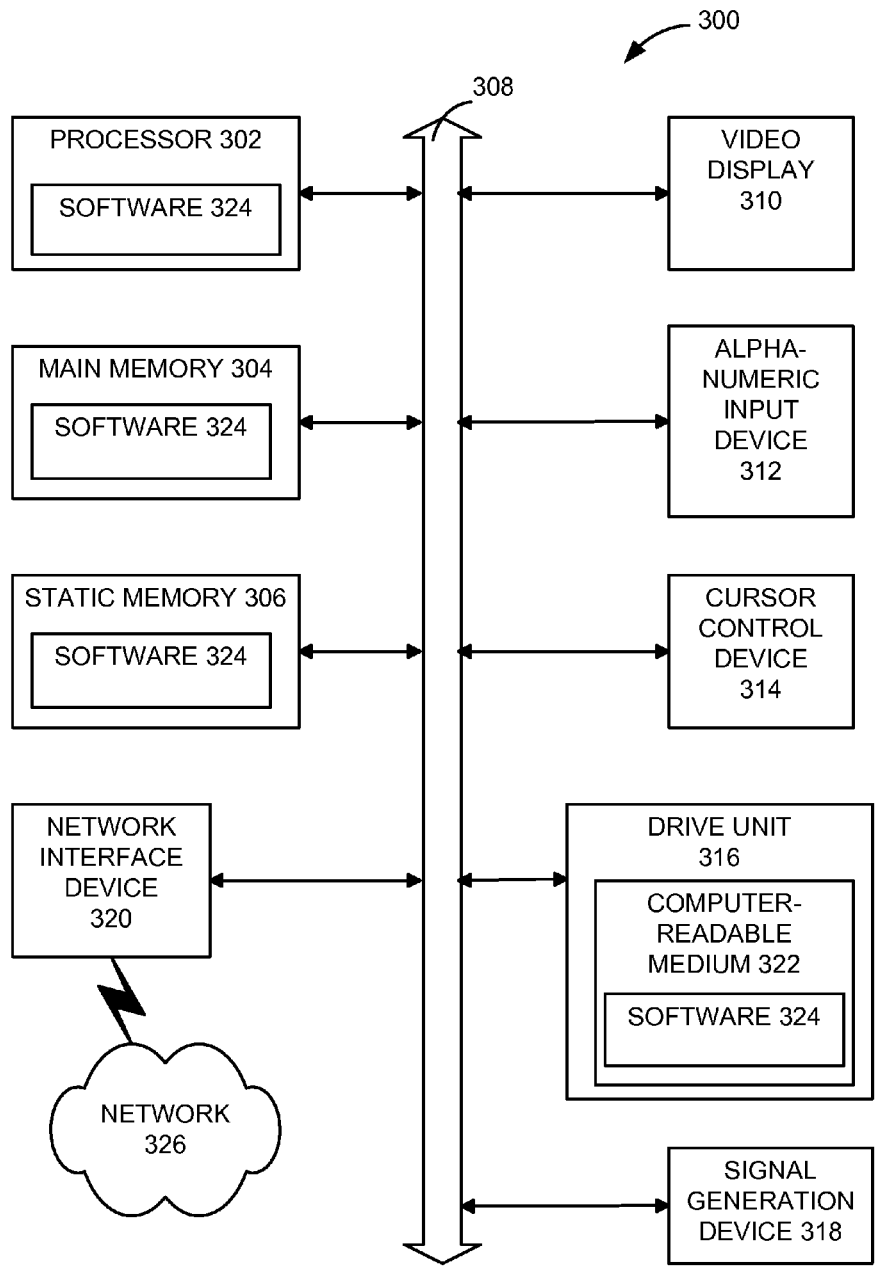
FIG. 10 illustrates a computer system in which embodiments of the disclosed techniques may be implemented, and illustrates the embodiment of the techniques in computer-readable media.

FIG. 10 is a block diagram of an exemplary computer system 300 within which a set of instructions, for causing a machine to perform any one or more of the techniques described herein, may be executed. In alternative embodiments, the computer system 300 operates as a standalone device or may be connected (e.g., networked) to other computer systems. In a networked deployment, the system 300 may operate in the capacity of a server or a client machine in a server-client network environment, or as a peer machine in a peer-to-peer (or distributed) network environment. The computer system 300 may be a personal computer (PC), a workstation, such as those typically used by circuit designers, a set-top box (STB), a Personal Digital Assistant (PDA), a cellular telephone, a web appliance, a network router, switch or bridge, or any machine capable of executing a set of instructions that specify actions to be taken by that machine, and networked versions of these.

The exemplary computer system 300 includes a processor 302 (e.g., a central processing unit (CPU), a graphics processing unit (GPU) or both), a main memory 304 and a static memory 306, which communicate with each other via a bus or interconnect 308. The computer system 300 may further include a video display unit 310 (e.g., a liquid crystal display (LCD) or a cathode ray tube (CRT)). The computer system 300 also includes an alphanumeric input device 312 (e.g., a keyboard), a user interface (UI) navigation device 314 (e.g., a mouse), a disk drive unit 316, a signal generation device 318 (e.g., a speaker) and a network interface device 320.

The disk drive unit 316 includes a computer-readable medium 322 on which is stored one or more sets of instructions and/or data structures (e.g., software 324) embodying embodiments of the various techniques disclosed herein. The software 324 may also reside, completely or at least partially, within the main memory 304 and/or within the processor 302 during execution thereof by the computer system 300, the main memory 304, and the processor 302, also constituting computer-readable media.

The software 324 and/or its associated data may further be transmitted or received over a network 326 via the network interface device 320 utilizing any one of a number of well-known transfer protocols (e.g., HTTP).

While the computer-readable medium 322 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the disclosed techniques, or that is capable of storing, encoding or carrying data structures utilized by or associated with such a set of instructions. The term "computer-readable medium" shall accordingly be taken to include, but not be limited to, solid-state memories, optical and magnetic media such as discs, and carrier wave signals.

Embodiments of the disclosed techniques can also be implemented in digital electronic circuitry, in computer hardware, in firmware, in special purpose logic circuitry such as an FPGA (field programmable gate array) or an ASIC (application-specific integrated circuit), in software, or in combinations of them, which again all comprise examples of "computer-readable media." When implemented as software, such software can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors 302 suitable for the execution of a computer program include, by way of example, both general and special purpose microprocessors, and any one or more processors of any kind of digital computer. Generally, a processor will receive instructions and data from a read-only memory or a random access memory or both.

To provide for interaction with a user, the invention can be implemented on a computer having a video display 310 for displaying information to the user and a keyboard and a pointing device such as a mouse or a trackball by which the user can provide input to the computer. Other kinds of devices can be used to provide for interaction with a user as well. For example, feedback provided to the user can be any form of sensory feedback, such as visual feedback, auditory feedback, or tactile feedback; and input from the user can be received in any form, including acoustic, speech, or tactile input.

Aspects of the disclose techniques can employ any form of communication network. Examples of communication networks 326 include a local area network ("LAN"), a wide area network ("WAN"), and the Internet.

It should be understood that the disclosed techniques can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A method implementable in a computer system for generating a multi-cycle signal vector suitable for use as the input to a circuit to be simulated in a simulation program, comprising:

determining in the computer system a time shift value for each of a plurality of cycles of a signal to be simulated, wherein the time shift values vary periodically between the plurality of cycles;

applying in the computer system each determined time shift value to create a time shifted vector for each of the plurality of cycles, wherein each time shifted vector comprises a sequence of voltage values each separated by a time step; and concatenating in the computer system the plurality of time shifted vectors to create the multi-cycle signal vector.

2. The method of claim 1, wherein the signal is a clock signal.

3. The method of claim 1, wherein the signal is a data signal.

4. The method of claim 3, wherein at least some of the time shifted vectors comprise transitions between logic states in the data signal.

5. The method of claim 1, wherein the time shift values are determined using an equation.

6. The method of claim 5, wherein the equation is sinusoidal.

7. The method of claim 5, wherein the equation is at least a function of a jitter frequency, and a jitter magnitude.

8. The method of claim 1, wherein the time shift values represent jitter or noise.

9. A method implementable in a computer system for generating a multi-cycle signal vector suitable for use as the input to a circuit to be simulated in a simulation program, comprising:

determining in the computer system a time shift value for each of a plurality of cycles of a signal to be simulated, wherein the time shift values vary periodically between the plurality of cycles, and wherein the time shift values are further phase shifted by a phase shift in each of the cycles;

applying in the computer system each determined time shift value to create a time shifted vector for each of the plurality of cycles, wherein each time shifted vector comprises a sequence of voltage values each separated by a time step; and concatenating in the computer system the plurality of time shifted vectors to create the multi-cycle signal vector.

10. The method of claim 9, wherein the signal is a clock signal.

11. The method of claim 9, wherein the signal is a data signal.

12. The method of claim 11, wherein at least some of the time shifted vectors comprise transitions between logic states in the data signal.

13. The method of claim 9, wherein the time shift values are determined using an equation.

14. The method of claim 13, wherein the equation is sinusoidal.

15. The method of claim 13, wherein the equation is at least a function of a jitter frequency, a jitter magnitude, and the phase shift.

16. The method of claim 9, wherein the time shift values represent jitter or noise.

17. The method of claim 9, wherein a magnitude of the phase shift corresponds to a delay experienced by the signal prior to arrival at the circuit.

18. A method for simulating the operation of a circuit in an integrated circuit, comprising:

generating in a computer system a first multi-cycle input vector representing a signal, wherein each cycle of the input vector includes a jitter which is periodical between the cycles, and wherein the jitter is further phase shifted by a phase shift to account for a time delay that the signal must travel within the integrated circuit, wherein the jitter is calculated for each cycle of the input vector using an equation that is at least a function of a jitter frequency, a jitter magnitude, and the time delay; and simulating the operation of the circuit in the computer system using at least the multi-cycle input vector as an input.

19. The method of claim 18, wherein the signal is a clock signal.

20. The method of claim 18, wherein the signal is a data signal.

21. The method of claim 18, wherein the input vector comprises a sequence of voltage values each separated by a time step.

22. A method for simulating the operation of at least one sample circuit for sampling a data signal using a clock signal in an integrated circuit, comprising:

generating in a computer system a multi-cycle clock input vector representing the clock signal, wherein each cycle of the clock input vector includes a jitter which is periodical between the cycles, wherein each cycle in the multi-cycle clock input vector comprises a sequence of voltage values each separated by a time step;

generating in a computer system a multi-cycle data input vector representing the data signal, wherein each cycle of the data input vector includes a jitter which is periodical between the cycles, and wherein each cycle in the multi-cycle data input vector comprises a sequence of voltage values each separated by a time step; and simulating the operation of the sample circuit in the computer system using the multi-cycle clock input vector and the multi-cycle data input vector as inputs.

23. The method of claim 22, wherein the either or both of the multi-cycle input vectors is further phase shifted to account for a time delay that the signal or signals must travel within the integrated circuit prior to its or their arrival at the sample circuit.

24. The method of claim 23, wherein the jitter is calculated for each cycle of either or both of the input vectors using at least one equation, and wherein the at least one equation is at least a function of a jitter frequency, a jitter magnitude, and the time delay.

25. The method of claim 22, wherein the integrated circuit comprises a synchronous dynamic random access memory.

26. The method of claim 22, wherein the jitter is calculated for each cycle of the input vectors using at least one equation.

27. The method of claim 26, wherein the at least one equation is sinusoidal.

28. The method of claim 26, wherein the at least one equation is at least a function of a jitter frequency and a jitter magnitude.

29. A method for simulating the operation of at least one circuit in an integrated circuit, comprising:

generating in a computer system a first multi-cycle input vector representing a first signal, wherein each cycle of the first multi-cycle input vector includes a jitter which is periodical between the cycles, wherein each cycle in the first multi-cycle input vector comprises a sequence of voltage values each separated by a time step;

generating in a computer system a second multi-cycle input vector representing a second signal, wherein each cycle of the second multi-cycle input vector includes a jitter which is periodical between the cycles, and wherein each cycle in the second multi-cycle input vector comprises a sequence of voltage values each separated by a time step; and simulating the operation of the circuit in the computer system using the first and second multi-cycle input vectors as inputs.

30. The method of claim 29, wherein at least one multi-cycle input vector is further phase shifted to account for a time delay that the signal must travel within the integrated circuit prior to its arrival at the circuit.

31. The method of claim 30, wherein the jitter is calculated for each cycle of the at least one input vector using at least one equation, and wherein the at least one equation is at least a function of a jitter frequency, a jitter magnitude, and the time delay.

32. The method of claim 29, wherein the integrated circuit comprises a synchronous dynamic random access memory.

33. The method of claim 29, wherein the jitter is calculated for each cycle of the input vectors using at least one equation.

34. The method of claim 33, wherein the at least one equation is sinusoidal.

35. The method of claim 33, wherein the at least one equation is at least a function of a jitter frequency and a jitter magnitude.

* * * * *